(12) United States Patent
Fischer et al.

(10) Patent No.: US 8,782,328 B2
(45) Date of Patent: Jul. 15, 2014

(54) METHOD FOR TRANSMITTING PROGRAM CODES TO A MEMORY OF A CONTROL DEVICE, PARTICULARLY FOR MOTOR VEHICLES

(75) Inventors: Uwe Fischer, Schwaikheim (DE); Ulrich Kanzler, Stein (DE)

(73) Assignee: Knorr-Bremse Systeme fuer Nutzfahrzeuge GmbH, Munich (DE)

( * ) Notice: Subject to any disclaimer, the term of this patent is extended or adjusted under 35 U.S.C. 154(b) by 199 days.

(21) Appl. No.: 12/998,451

(22) PCT Filed: Oct. 12, 2009

(86) PCT No.: PCT/EP2009/007313
§ 371 (c)(1),
(2), (4) Date: Jul. 14, 2011

(87) PCT Pub. No.: WO2010/046043
PCT Pub. Date: Apr. 29, 2010

(65) Prior Publication Data
US 2011/0264844 A1    Oct. 27, 2011

(30) Foreign Application Priority Data
Oct. 23, 2008 (DE) .......................... 10 2008 052 955

(51) Int. Cl.
*G06F 13/00* (2006.01)
(52) U.S. Cl.
USPC .................................... 711/103; 711/E12.04
(58) Field of Classification Search
CPC ...................................................... G06F 12/00
USPC ......................................... 711/103, E12.008
See application file for complete search history.

(56) References Cited

U.S. PATENT DOCUMENTS

| | | | | |
|---|---|---|---|---|
| 4,021,782 A | * | 5/1977 | Hoerning | 341/51 |
| 5,937,065 A | * | 8/1999 | Simon et al. | 380/262 |
| 6,023,233 A | * | 2/2000 | Craven et al. | 341/51 |
| 6,145,069 A | * | 11/2000 | Dye | 711/170 |
| 6,670,897 B1 | * | 12/2003 | Lin | 341/65 |
| 7,248,632 B1 | * | 7/2007 | McKenzie et al. | 375/240.2 |

(Continued)

FOREIGN PATENT DOCUMENTS

| | | |
|---|---|---|
| DE | 100 12 272 | 9/2001 |
| DE | 100 37 397 | 2/2002 |

(Continued)

OTHER PUBLICATIONS

Lopez, Thierry, Oct. 2003, FR 2837946 A1 [Translation] [retrieve date Mar. 7, 2013] [pp. 1-5].*

(Continued)

*Primary Examiner* — Sean D Rossiter
(74) *Attorney, Agent, or Firm* — Kenyon & Kenyon LLP

(57) ABSTRACT

A method is described for transmitting program codes to a program memory in a controller, particularly in a motor vehicle, having the following operations: a) connecting an interface in a controller to a programming appliance which contains the program codes, setting all the memory cells of the program memory in the controller to a standard value, compressing the program code in the programming appliance on the basis of a lossless data compression process, transmitting the compressed program code to the controller, decompressing the received program code in the controller, and storing the decompressed program code in the program memory in the controller.

6 Claims, 6 Drawing Sheets

(56) References Cited

U.S. PATENT DOCUMENTS

| | | | |
|---|---|---|---|
| 7,346,435 B2 | 3/2008 | Amendola et al. | |
| 7,774,382 B2 | 8/2010 | Franke et al. | |
| 2007/0022243 A1* | 1/2007 | Rudelic | 711/103 |
| 2009/0182437 A1 | 7/2009 | Frey | |
| 2009/0326759 A1 | 12/2009 | Hensel et al. | |

FOREIGN PATENT DOCUMENTS

| | | |
|---|---|---|
| DE | 600 00 252 | 12/2002 |
| DE | 102 34 063 | 2/2004 |
| DE | 10 2004 005676 | 8/2005 |
| DE | 10 2005 013 285 | 10/2006 |
| DE | 10 2005 034 168 | 2/2007 |
| DE | 10 2005 045 149 | 4/2007 |
| DE | 10 2006 013762 | 9/2007 |
| DE | 102006013762 A1 * | 9/2007 |
| DE | 10 2006 016891 | 10/2007 |
| EP | 1 039 419 | 9/2000 |
| FR | 2 837 946 | 10/2003 |
| FR | 2837946 A1 * | 10/2003 |

OTHER PUBLICATIONS

Liebehenschel, Jens, Sep. 2007, DE 102006013762 A1 [Translation] [retrieve date Mar. 7, 2013] [pp. 1-5].*

European Patent Office, International Preliminary Report on Patentability and Written Opinion, May 5, 2011, from International Patent Application No. PCT/EP2009/007313, filed on Oct. 12, 2009.

European Patent Office, Translation of International Preliminary Report on Patentability and Written Opinion, May 5, 2011, from International Patent Application No. PCT/EP2009/007313, filed on Oct. 12, 2009.

D.A. Huffman : "A Method for the Construction of Minimum-Redundancy Codes". In : Proceedings of the I.R.E., Sep. 1952, pp. 1098-1102.

* cited by examiner

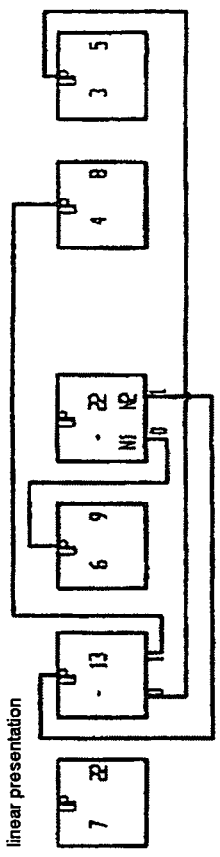
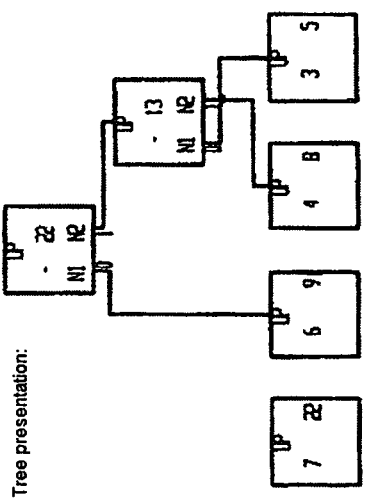

4. All the leaves from the root to the top of the tree are now linked the tree is finished.

linear presentation

Tree presentation

To speed up the sorting processes, an implementation using an ancillary vector of pointers or indices has been chosen
To speed up the processing, the tree is not sorted but rather the indices or pointers in the ancillary vector are sorted Situation following step

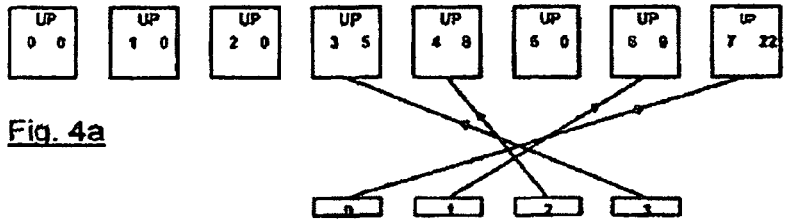

Fig. 4a

Situation following step
Unused codes are not shown

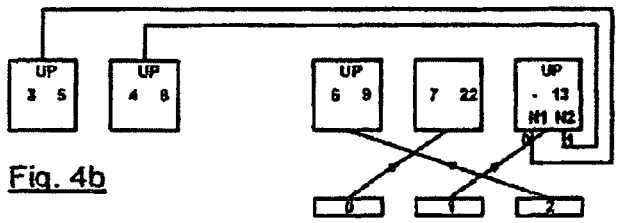

Fig. 4b

Situation following step

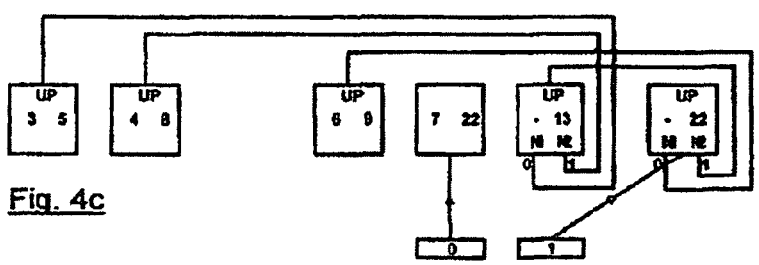

Fig. 4c

Situation following step
The pointer to the top of the tree is left over

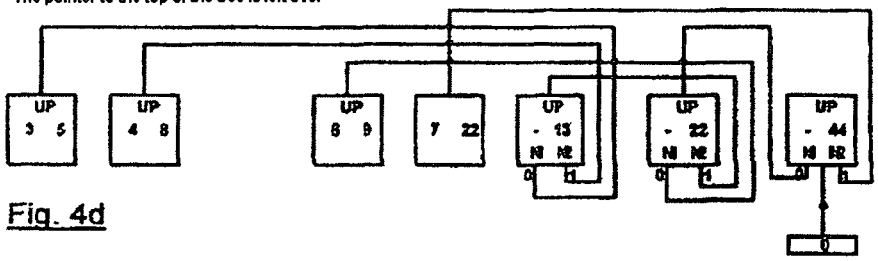

Fig. 4d

Huffman tree for decoding
"0": means the right-hand path and "1": means the left-hand path needs to be chosen
This association must be made in identical fashion to the coding

METHOD FOR TRANSMITTING PROGRAM CODES TO A MEMORY OF A CONTROL DEVICE, PARTICULARLY FOR MOTOR VEHICLES

FIELD OF THE INVENTION

The present invention relates to a method for transmitting program codes to a program memory in a controller.

BACKGROUND INFORMATION

German patent document DE 10 2006 016 891 A1 discusses a method for transmitting program codes to a program memory.

Modern motor vehicles contain one or more electronic controllers which contain a program memory which can be programmed, i.e. can have program codes written to it, when the controller is in the installed state. The program memory is usually what is known as a flash memory, which is frequently also integrated in a microcontroller.

Standard controllers contain an interface, also called diagnosis interface, which is used for transmitting commands and data. The interface used is frequently a "CAN" bus. A standard diagnosis protocol is UDS based on ISO 14229. These are cited mainly by way of example, since there are a multiplicity of other interfaces and protocols.

The controller usually also contains a piece of diagnosis software which uses the diagnosis interface to provide commands for erasing and programming the program memory. This software is frequently called a "bootloader".

For the purpose of communication with the controller, a programming appliance is used which has the requisite counterpart to the diagnosis interface in the controller. Such a programming appliance is frequently also called a diagnosis appliance or diagnosis tester. In practice, this programming appliance is today often a personal computer, such as a laptop.

When controllers are programmed, very large volumes of data for program codes are transmitted, which is very time-consuming using today's methods. Controllers in motor vehicles are frequently general-purpose controllers which are individually programmed for the respective motor vehicle at the end of the line during the manufacture of the motor vehicle. The time requirement for programming the controller is therefore a critical factor for the manufacture of the motor vehicle and needs to be as short as possible.

During operation of the motor vehicle too, changes (what are known as upgrades) of the software need to be made in practice, which is normally done in a workshop. In this case too, the period of time for reprogramming the controller needs to be kept as short as possible.

German patent document DE 10 2006 016 891 A1, cited at the outset, is concerned with the subsequent change to the software of a controller and distinguishes between a piece of mass-produced software and a piece of "upload software". To reduce the level of involvement for subsequently loading the upload software, said document proposes providing two separate memory areas, namely one for the mass-produced software and one for the upload software. In order to extend the functionality of the controller, it is then merely necessary to transmit the upload software to the separate memory area rather than the entire software.

This does not result in any advantages for the initial programming of the controller.

SUMMARY OF THE INVENTION

It is an object of the exemplary embodiments and/or exemplary methods of the present invention to improve the method of the type cited at the outset such that the period of time for transmitting program codes to the memory in the controller is substantially shortened.

This object is achieved by the features specified herein. Advantageous refinements and developments of the present invention are also disclosed and described herein.

An aspect of the exemplary embodiments and/or exemplary methods of the present invention is to set all the memory cells of the memory to a standard value (default) before the program codes are written to the memory in the controller; then to subject the program codes that are to be transmitted by the programming appliance to lossless data compression in the programming appliance, which may be on the basis of the Huffman code, then to transmit the compressed program codes to the controller, subsequently to decompress the program codes in the controller, and finally to store the compressed program codes in the memory of the controller.

Setting all the memory cells of the memory to the standard value ensures that there is no erroneous program code in the memory. The transmission of the compressed program codes substantially reduces the volume of data to be transmitted and hence also substantially shortens the transmission time. The use of a lossless data compression method also gives rise to no data losses. PHuffman coding can be used for compression and decompression, this achieving a high compression factor.

According to one advantageous development of the exemplary embodiments and/or exemplary methods of the present invention, when all the memory cells of the memory are set to a standard value, the standard value is chosen such that it contains an invalid program code (what is known as illegal Opcode). In many microprocessors, the value of said invalid program code is stored in the microprocessor. Depending on the microprocessor used or the programming language used, it may alternatively be a different value, which is then transmitted from the programming appliance to the controller in an initialization phase before the program codes are transmitted.

In accordance with one variant of the exemplary embodiments and/or exemplary methods of the present invention, it is possible for the entire content of the memory in the controller to be transmitted from the programming appliance to the controller, that is to say including the content of unused memory cells. However, only required program codes need to be transmitted, since unused memory cells or unused address ranges are in prior use by the standard value. This further reduces the volume of data to be transmitted.

The exemplary embodiments and/or exemplary methods of the present invention are explained in more detail below in connection with an exemplary embodiment.

BRIEF DESCRIPTION OF THE DRAWINGS

FIGS. 3*a*, 3*b*, 3*c*, 3*d*, 3*e*, 3*f*, and 3*g* show an illustration of the individual steps for the data compression.

FIG. 4 shows an illustration of method steps of the data compression using an ancillary vector.

DETAILED DESCRIPTION

Figure 1:
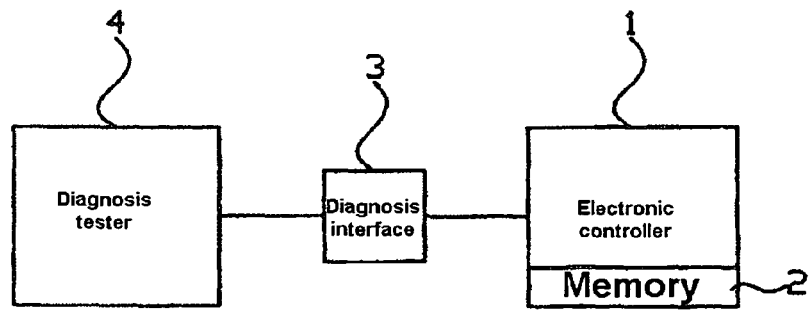
FIG. 1 shows a block diagram of a controller and a programming appliance.

The electronic controller 1 in FIG. 1, labeled ECU (Electronic Control Unit), has a program memory 2 which is in the form of an erasable and writable memory. The controller 1 can be connected by an interface 3 to a programming appliance 4, which may be a PC, for example, such as a laptop. The programming appliance 4 stores program codes which need to be transmitted to the controller 1 via the interface 3. The program codes are usually available as a binary or hex file.

The controller 1 is "programmed" by virtue of the program codes being transmitted from the programming appliance 4 to the control unit 1 and being stored therein in the program memory 2.

Previously, the controller was programmed or reprogrammed by writing the entire program with the individual program codes to the program memory 2. Any previously used memory cells in the program memory 2 are then overwritten.

Figure 2:
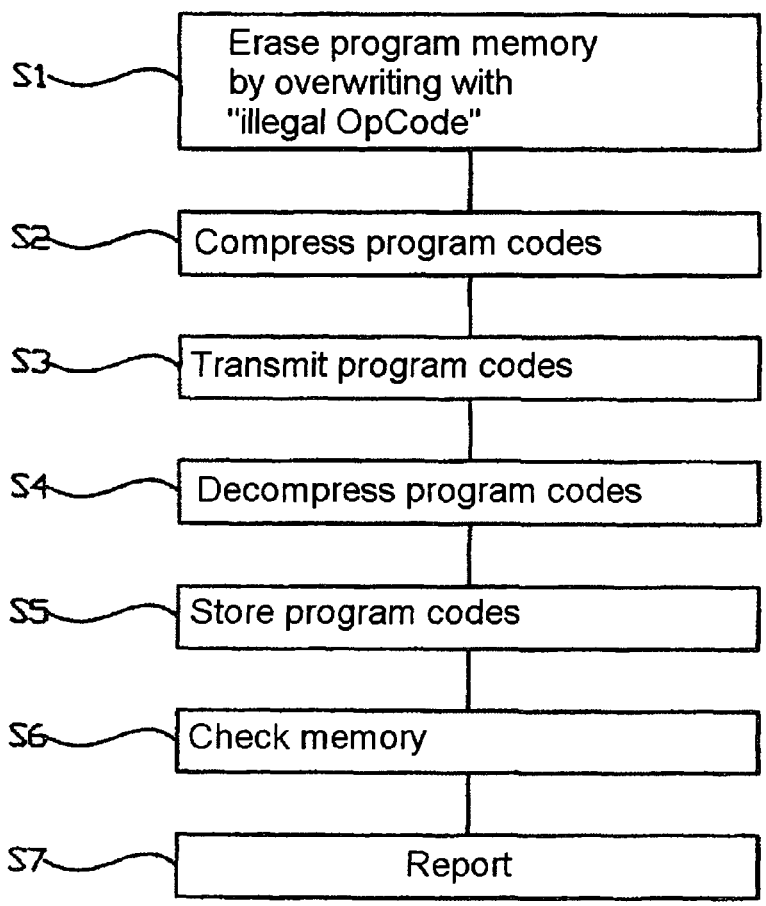
FIG. 2 shows a flowchart of the method steps taking place in the present invention.

The method illustrated in FIG. 2 in accordance with the present invention works as follows: in a first step S1, the programming appliance 4 first of all uses the interface 3 to the control unit 1 to send the "bootloader" of the controller 1 a command which is used to erase the program memory 2. This erasure may involve all of the memory cells of the program memory 2 having an invalid program code written to them (illegal Opcode). This code may be in prior use as a standard value (default) in the control unit 1. Depending on the microprocessor used in the control unit 1, however, it is also possible for this relevant code to be transmitted from the programming appliance 4 to the controller 1.

In a second step S2, the program codes stored in the programming appliance 4 are subjected to a non-lossy compression method, that is to say are coded or compressed.

The demands on the compression method are minimal consumption of resources, particularly computation time, program memory and main memory.

Some existing memory chips can only be programmed without interruption. In other memory chips, at least predetermined areas need to be written to without interruption. This results in the requirement that the decompressed data need to be available without interruption at least on an area-by-area basis. The decompressed data are easiest to handle when they arrive without interruption over the entire memory area to be programmed. Since the available main memory in the controller 1 is usually very much smaller than the program memory 2, it is not possible to decompress all of the data prior to programming. It is therefore necessary for the data that is to be transmitted to arrive without interruption.

For lossless compression of the program codes to be transmitted, Huffman coding, which is known per se, has been found to be particularly suitable, this coding involving the data to be transmitted arriving without interruption, in contrast to many other coding methods. This coding or compression can be used to implement lossless compression and decompression of the data to be transmitted. In this case, in principle, frequently occurring data are coded into short keywords and less frequently occurring data are coded into longer keywords.

The efficiency of the method is dependent on the distribution of the data which are to be transmitted. The more frequently certain data are available, the more frequently short keywords are used and hence a higher compression factor is attained.

Sorting processes are used to produce a "tree" which can be used to create a "dictionary" for the coding. From this tree, it is possible to create a corresponding tree for the decompression. This tree either needs to be concomitantly transmitted to the control unit 1 or it may be stored permanently therein. In this case, it is self-evidently also necessary to use the same dictionary for the coding.

An adaptive variant in which the respective coding tree is produced and transmitted afresh provides better results for the compression and requires more main memory in the control unit 1, but less program memory, which is where the dictionary is stored. Depending on the application, the adaptive or nonadaptive variant may be more advantageous.

The structure of the decoding tree is transmitted in an uncompressed area at the beginning of the data stream in the adaptive variant. This is then followed by the decoding tree, which is followed by the compressed data.

It makes sense for the coding to be performed for volumes of data which are a multiple of one byte (8 bits). The size of the decoding tree increases greatly with the length "L" of the words to be decoded. The length of the Huffman-coded characters may be greater for rare characters than the length of the uncoded character. Since, particularly in the case of 16-bit coding, not all characters occur in practice, the decoding tree can become correspondingly smaller. Nevertheless, it becomes clear that smaller data areas are better coded on an 8-bit basis.

The 16-bit coding provided a higher compression factor in experiments. However, this is effective only upward of a minimum volume of data to be transmitted, since the decoding tree also needs to be transmitted.

In the case of the nonadaptive variant, memory space for the decoding tree accordingly needs to be made available in the nonvolatile program memory.

The coding is explained below with reference to an exemplary embodiment in connection with FIGS. 3 to 5.

First of all, the frequency of all the occurring characters is ascertained, which is explained by the following example.

| Frequency | 0 | 0 | 0 | 5 | 8 | 0 | 9 | 22 |
|-----------|---|---|---|---|---|---|---|----|
| Character | 0 | 1 | 2 | 3 | 4 | 5 | 6 | 7  |

In the next step, the characters are sorted according to frequency (FIG. 3a), which can be done in descending or ascending sorting order. In descending order, the following is obtained from the example above:

| Frequency | 22 | 9 | 8 | 5 | 0 | 0 | 0 | 0 |
|-----------|----|---|---|---|---|---|---|---|
| Character | 7  | 6 | 4 | 3 | 0 | 1 | 2 | 5 |

The characters and the respective "0", "1", "2" and "5" with the frequency "0" can be eliminated.

Figure 3A:
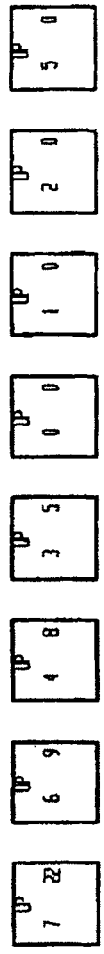
Figure 3B:
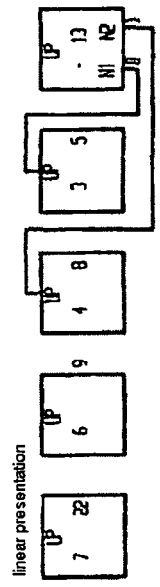
Figure 3C:
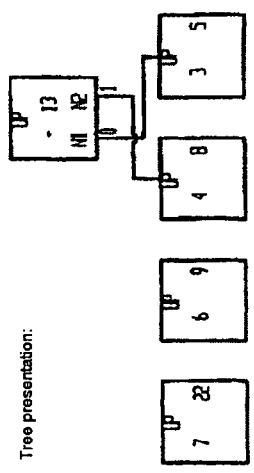

The frequencies of the two characters with the lowest frequency are added and produce a new "leaf" in the tree (FIG. 3b and FIG. 3c). This leaf is created as an additional element in an "array" of corresponding structures, and the indices or pointers are entered depending on the implementation. In this case, in one exemplary implementation, "leaves" are not actually sorted but rather pointers or indices for the leaves are stored in an ancillary vector (FIG. 4). Only these are sorted, which minimizes the involvement for sorting.

When a new leaf is produced, it is added and the last two indices are removed and instead the index of the new leaf is entered (FIGS. 3d and 3e).

Figure 3F:
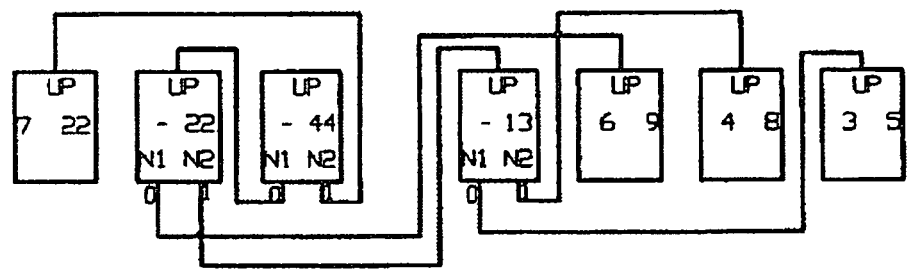
Figure 3G:
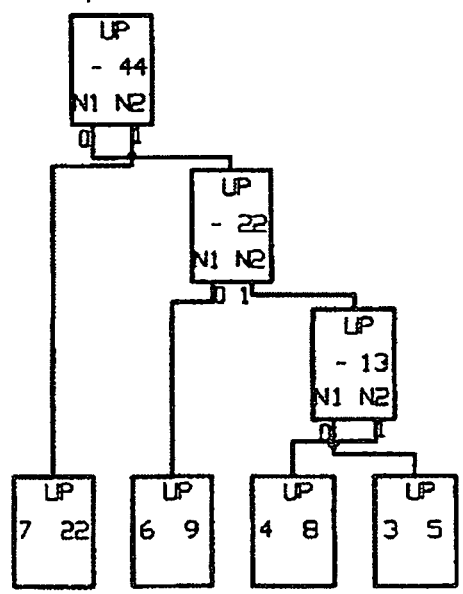

This is repeated until another single last entry is left over which points to the top of the tree (FIGS. 3f and 3g).

FIGS. 3a, 3d and 3f show a corresponding tree in linear form, because it is easy to implement in this form. Using this tree, it is now possible to produce the coding and decoding tables.

On the basis of the example above and the otherwise self-explanatory FIG. 3, the following coding table is then obtained:

| Character | Code  | Length |
|-----------|-------|--------|
| 0         | —     |        |
| 1         | —     |        |
| 2         | —     |        |
| 3         | 0-1-0 | 3      |
| 4         | 1-1-0 | 3      |
| 5         | —     |        |
| 6         | 0-0   | 2      |
| 7         | 1     | 1      |

In order to ascertain the code for the "3" for example, 0-1-0 is selected, i.e. the length is 3. This results in the following compression factor for the individual characters

| Character | Length | Number | Bits |
|-----------|--------|--------|------|
| 3         | 3      | 5      | 15   |
| 4         | 3      | 8      | 24   |
| 6         | 2      | 9      | 18   |
| 7         | 1      | 22     | 22   |
|           |        |        | 79 in total |

In this case, 79 bits are thus required in order to code the characters. In the case of 8-bit coding, on the other hand, 352 characters would be required. This results in a compression factor of approximately 0.22.

Figure 5:
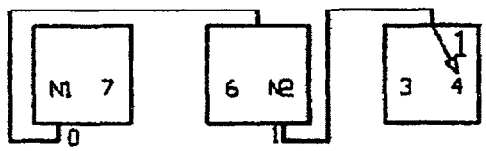
FIG. 5 shows an illustration of a decoding tree.

The decoding tree required for decoding is constructed from the top of the tree (FIG. 5). For characters which are not available, no entries are produced. This tree is in turn a concatenated list. The codes to be decoded are analyzed from right to left on the basis of the above coding table. The codes are also transmitted in this direction. In the example above, the 4 is thus transmitted as 0-1-1.

In order to be able to identify whether further decoding is required or a valid character has been found, the roots in the tree are denoted accordingly. For this, an additional bit per entry suffices in order to distinguish a valid character from a pointer. The entries N1 and N2 accordingly contain pointers or the decoded character, which is shown in FIG. 3. The left-hand path therein means "0" and the right-hand path "1", respectively. This association needs to be made in identical fashion to the coding. If the sequence of 0-1-1 is received in the example in FIG. 3, decoding (FIG. 5) involves the entries N1, N2 being followed starting from the top of the tree (left-hand leaf), and the result obtained is the "4".

The number of leaves in the decoding tree is less than or equal to the number of characters to be coded. In the example shown, three leaves are sufficient for a decoding tree of four codes. In the chosen implementation, the entries N1, N2 contain either a pointer or index or the coded character. For the number of bits in the indices, the following is thus obtained:

$$B = \mathrm{Log}(L)/\mathrm{Log}(2) + 1 = 9 \text{ (for 8-bit coding)}$$

for rounding to the next highest integer. In this case, L is the length of the words to be coded (e.g. 8 or 16).

The additional bit is necessary in order to distinguish indices from valid characters. For each leaf, the entries N1 and N2 are required. That is to say that the minimum length obtained for the decoding table is 3*2*9=54 bits.

In addition, it is also necessary to transmit the information about the size of the decoding table and the number of bits B per entry to the control unit.

Returning to FIG. 2, the program codes thus Huffman-compressed are transmitted from the programming appliance 4 via the interface 3 to the control unit 1 in step S3, subsequently decompressed as appropriate in step S4 and written to the program memory 2 in step S5. Finally, it is also possible to check the transmitted program codes, for example by virtue of a checksum check or a cyclic redundancy check (CRC) (cf. step S7). If required, the result of this check can be reported back to the programming appliance 4 in a step S8.

The compression method described is technically simple but very effective. For the compression, essentially only simple sorting processes are required. The decompression merely requires simple tracking of entries in the decoding tree. The compression is better the more irregularly the coded characters occur. The program codes to be coded for controllers in motor vehicles are codes for microprocessors, in which, empirically, certain codes (Opcodes) occur significantly more frequently than others, which means that the compression method described can work very well. Depending on the filling level of the program memory, it is additionally possible to obtain a significant saving as a result of the nontransmission of program codes for unused areas. By using invalid program codes (illegal Opcodes) for these areas, additional security is obtained during operation in the event of faults or software errors, since microprocessors trigger an interruption in the event of invalid program codes, which can be used to identify the error.

Since, in practice, the program memory of the controller is not completely full and has relatively large gaps in the address range, it is also advantageous to fill these gaps with the value for "illegal Opcode".

The invention claimed is:

1. A method for transmitting program codes to a program memory in a controller, which is in a motor vehicle, the method comprising:
   connecting an interface in a controller, having diagnosis software, to a programming appliance which contains the program codes, wherein the interface is a diagnosis interface for erasing and programming the memory, and wherein the programming appliance has a counterpart to the diagnosis interface in the controller;
   setting all the memory cells of the program memory in the controller to a standard value before the program codes are written to the memory in the controller, so as to provide that there is no erroneous program code in the memory;
   compressing the program code in the programming appliance based on a lossless data compression process;
   transmitting the compressed program code to the controller;
   decompressing the received program code in the controller; and
   storing the decompressed program code in the program memory in the controller;
   wherein the transmitted compressed program code arrives without interruption,
   wherein there are gaps in the address range of the program memory of the controller, and
   wherein the gaps are filled with a value for an invalid program code so as to obtain additional security during operation in the event of a fault or a software error, so as to trigger an interruption in the event of an invalid program code for identifying the error.

2. The method of claim 1, wherein the invalid program code is transmitted from the programming appliance to the controller.

3. The method of claim 1, wherein the programming appliance transmits only valid program codes sequentially to the controller, while a value of the invalid program code is transmitted no more than once.

4. The method of claim 1, wherein the program codes are compressed and decompressed based on Huffman coding.

5. The method of claim 4, wherein the programming appliance transmits only valid program codes sequentially to the controller, while a value of the invalid program code is transmitted no more than once.

6. The method of claim 1, wherein the programming appliance is a personal computer.

* * * * *